(12) United States Patent
Wu et al.

(10) Patent No.: US 11,125,513 B2
(45) Date of Patent: Sep. 21, 2021

(54) FORMABLE INTERFACE AND SHIELDING STRUCTURES

(71) Applicant: MICROSOFT TECHNOLOGY LICENSING, LLC, Redmond, WA (US)

(72) Inventors: Renee Wu, Los Altos, CA (US); Michael Nikkhoo, Saratoga, CA (US)

(73) Assignee: Microsoft Technology Licensing, LLC, Redmond, WA (US)

( * ) Notice: Subject to any disclaimer, the term of this patent is extended or adjusted under 35 U.S.C. 154(b) by 258 days.

(21) Appl. No.: 16/160,830

(22) Filed: Oct. 15, 2018

(65) Prior Publication Data
US 2019/0049197 A1 Feb. 14, 2019

Related U.S. Application Data

(62) Division of application No. 14/975,676, filed on Dec. 18, 2015, now abandoned.

(51) Int. Cl.
*F28F 21/02* (2006.01)
*F28F 21/06* (2006.01)
(Continued)

(52) U.S. Cl.
CPC .............. *F28F 21/02* (2013.01); *B23P 15/26* (2013.01); *F28F 21/065* (2013.01); *H01L 23/3737* (2013.01); *H01L 23/42* (2013.01); *H01L 23/552* (2013.01); *Y10T 29/4935* (2015.01); *Y10T 29/4998* (2015.01); *Y10T 29/49826* (2015.01);
(Continued)

(58) Field of Classification Search
CPC ........... Y10T 29/4998; Y10T 29/49982; Y10T 29/49826; Y10T 29/49885; Y10T 29/49904; Y10T 29/4935; B23P 15/26; B29C 65/14; B29C 65/1496; B29C 65/1696; B29C 66/73753; B29C 66/73122
USPC ...... 29/527.1, 527.2, 428, 458, 469, 890.03; 156/273.3, 275.5
See application file for complete search history.

(56) References Cited

U.S. PATENT DOCUMENTS 4,418,284 A * 11/1983 Ogawa .................. G03F 7/0007
156/263
4,619,804 A * 10/1986 Leonard ................ C03C 23/006
156/272.8

(Continued)

*Primary Examiner* — Sarang Afzali
*Assistant Examiner* — Darrell C Ford
(74) *Attorney, Agent, or Firm* — Newport IP, LLC; Jacob P. Rohwer

(57) ABSTRACT

A formable structure comprises a first material having a first level of viscosity and a second material having a second level of viscosity, wherein the second material is formed to hold at least a portion of the first material in a particular position or a particular shape. The first material can be configured to function as a thermal interface between two or more hardware components. The second material can be configured to have a higher viscosity than the first material. In one illustrative example, the second material can include a light-activated resin that is configured to harden when exposed to one or more treatments. By the use of the first material and second material, the techniques disclosed herein are adaptable to gaps having a wide range of sizes, which is difficult to do with traditional thermal interface materials. The second material can also function as an EMI shield.

8 Claims, 9 Drawing Sheets

(51) Int. Cl.
 *B23P 15/26* (2006.01)
 *H01L 23/373* (2006.01)
 *H01L 23/42* (2006.01)
 *H01L 23/552* (2006.01)

(52) U.S. Cl.
 CPC .... *Y10T 29/49885* (2015.01); *Y10T 29/49904* (2015.01); *Y10T 29/49982* (2015.01)

(56) References Cited

U.S. PATENT DOCUMENTS

| | | | | |
|---|---|---|---|---|
| 5,348,693 A * | 9/1994 | Taylor | ............... | H05K 3/4664 264/401 |
| 6,004,413 A * | 12/1999 | Couttenier | ............... | B29C 35/10 156/273.5 |
| 6,042,682 A * | 3/2000 | Funaya | ............... | H01L 21/563 156/273.3 |
| 6,395,124 B1 * | 5/2002 | Oxman | ............... | B32B 7/12 156/275.5 |
| 6,790,309 B2 * | 9/2004 | Miyagawa | ............... | B41J 2/1603 156/272.2 |
| 6,977,025 B2 * | 12/2005 | McArdle | ............... | G03F 7/34 156/247 |
| 7,001,853 B1 * | 2/2006 | Brown | ............... | B01L 3/502707 438/780 |
| 10,866,032 B2 * | 12/2020 | Kim | ............... | B32B 3/26 |
| 2010/0266450 A1 * | 10/2010 | Wimberger-Friedl | ............... | B01L 3/5023 422/68.1 |
| 2012/0089180 A1 * | 4/2012 | Fathi | ............... | B32B 9/04 606/214 |
| 2013/0183499 A1 * | 7/2013 | Kido | ............... | G03F 7/027 428/195.1 |
| 2014/0071417 A1 * | 3/2014 | Grespan | ............... | G03F 7/70008 355/67 |

* cited by examiner

FORMABLE INTERFACE AND SHIELDING STRUCTURES

PRIORITY APPLICATION(S)

This application is a divisional application of, and claims the benefit of priority to, U.S. Non-Provisional application Ser. No. 14/975,676 which was filed on Dec. 18, 2015, the entire contents of which are incorporated herein by reference.

BACKGROUND

Thermal interface materials have been used to help solve heat transfer problems, where heat needs to be efficiently moved from one component to another. Air is a very poor thermal conductor, and so a good thermal interface material should have not only high inherent thermal conductivity, it should also have good wet out to the surfaces it comes in contact with to minimize the amount of air gaps at the interfaces. Additionally, most applications also require some degree of adhesion from the thermal interface materials. Reliability over time, ease of use, and cost are also factors that are taken into consideration when choosing a thermal interface material.

Depending on the application, there are a variety of materials currently in use as thermal interface materials: thermal greases, thermally conductive adhesives, phase change materials, gap pads, etc. However, each of these solutions has its own set of drawbacks. For instance, thermal greases, while relatively highly thermally conductive, lack adhesion, and are prone to reliability issues over time. Phase change materials also lack adhesion and require an initial heat cycle before use. In addition, each type of thermal interface material generally has a narrow range of gaps that it is designed to fill. Therefore, applications that have a wide range of gap thicknesses present a number of other challenges.

The disclosure made herein is presented with respect to these and other considerations. It is with respect to these and other considerations that the disclosure made herein is presented.

SUMMARY

Technologies described herein provide formable interface and shielding structures. In some configurations, a formable structure comprises a first material having a first level of viscosity and a second material having a second level of viscosity, wherein the second material is formed to hold at least a portion of the first material in a particular position or a particular shape. The first material can be configured to function as a thermal interface between two or more hardware components. In one illustrative example, the first material can function as a thermal interface between a processor and a heat sink. The first material, for example, can be loaded with thermally conductive filler particles such as at least one carbon-based material, at least one boron nitride-based material, at least one silica, at least one alumina, at least one metal, or any combination thereof. The first material can include a low viscosity filler, such as at least one epoxy, at least one silicone, at least one urethane, at least one acrylic, or any combination thereof to help enable a high degree of wet-out, which will improve thermal connectivity between the components. The second material can be configured to have a higher viscosity than the first material. In one illustrative example, the second material can include a light-activated resin that causes the second material to harden when exposed to specific light spectrums. By selecting various combinations of materials described herein, a wide range of scenarios can be accommodated. For instance, the techniques disclosed herein are adaptable to gaps having a wide range of sizes, which is difficult to do with traditional thermal interface materials. For illustrative purposes, the first material is also referred to herein as an "inner filler" and the second material is referred to herein as a "dam."

In some configurations, the second material can also be configured to cover one or more components to function as an electromagnetic interference (EMI) shield. In such configurations, the second material can be loaded with electrically conductive filler particles, such as various metals or carbon-based materials. By electrically connecting the second material to one or more appropriate locations, the second material can serve as an EMI shield as well as a barrier to hold the first material in a particular position and/or a particular shape. For illustrative purposes the particular position and/or the particular shape can include any predetermined form needed for a particular application, such as a thermal conductor that may be needed for a chip and a heat sink. As electrically conductive materials can be highly thermally conductive, the second material can also contribute to an improved thermal performance of a system overall.

It should be appreciated that the above-described subject matter may also be implemented as part of a computer-controlled apparatus, a computing system, or as part of an article of manufacture. These and various other features will be apparent from a reading of the following Detailed Description and a review of the associated drawings.

This Summary is provided to introduce a selection of concepts in a simplified form that are further described below in the Detailed Description. This Summary is not intended to identify key features or essential features of the claimed subject matter, nor is it intended that this Summary be used to limit the scope of the claimed subject matter. Furthermore, the claimed subject matter is not limited to implementations that solve any or all disadvantages noted in any part of this disclosure.

DETAILED DESCRIPTION

Technologies described herein provide formable interface and shielding structures. In some configurations, a formable structure comprises a first material having a first level of viscosity and a second material having a second level of viscosity, wherein the second material is formed to hold at least a portion of the first material in a particular position or a particular shape. The first material can be configured to function as a thermal interface between two or more hardware components. In one illustrative example, the first material can function as a thermal interface between a processor and a heat sink. The first material, for example, can be loaded with thermally conductive filler particles such as at least one carbon-based material, at least one boron nitride-based material, at least one silica, at least one alumina, at least one metal, or any combination thereof. The first material can include a low viscosity filler, such as at least one epoxy, at least one silicone, at least one urethane, at least one acrylic, or any combination thereof to help enable a high degree of wet-out, which will improve thermal connectivity between the components. The second material can be configured to have a higher viscosity than the first material. In one illustrative example, the second material can include a light-activated resin that causes the second material to harden when exposed to specific light spectrums.

In some configurations, the second material can also be configured to cover one or more components to function as an electromagnetic interference (EMI) shield. In such configurations, the second material can be loaded with electrically conductive filler particles, such as various metals or carbon-based materials. By electrically connecting the second material to one or more appropriate locations, the second material can serve as an EMI shield as well as a barrier to hold the first material in a particular position and/or a particular shape. For illustrative purposes the particular position and/or the particular shape can include any predetermined form needed for a particular application, such as a thermal conductor that may be needed for a chip and a heat sink. As electrically conductive materials can be highly thermally conductive, the second material can also contribute to an improved thermal performance of a system overall.

Figure 1A:
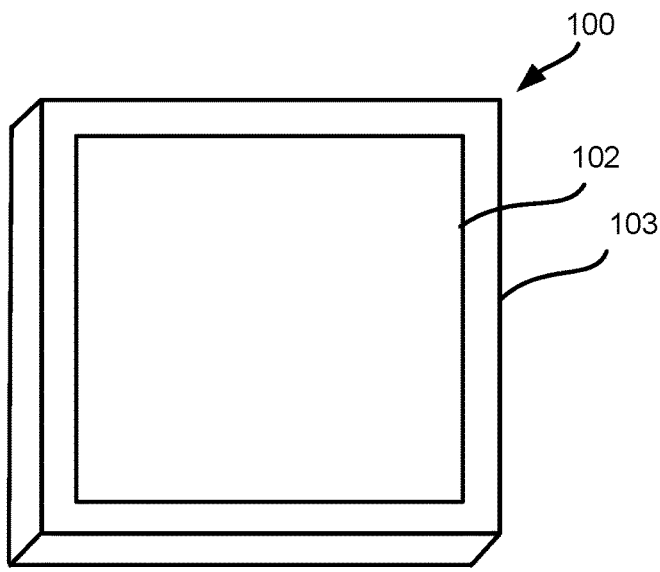
FIG. 1A is a perspective view showing an example of a formable structure having an inner filler surrounded by a dam.

FIG. 1A illustrates a perspective view of a formable structure 100 having an inner filler 102 surrounded by a dam 103. In some configurations, the inner filler 102 comprises a first material having a first level of viscosity. The first level of viscosity can be selected such that the inner filler 102 enables a predetermined degree of wet-out. Since the first level of viscosity may not be suitable for maintaining a particular shape or a particular position, the dam 103 can be formed to hold at least a portion of the inner filler 102 in the desired shape and/or position. As shown in FIG. 1A, the walls of the dam 103 can form a barrier around one or more sides of the inner filler 102.

This example is provided for illustrative purposes and is not to be construed as limiting. It can be appreciated that the formable structure 100 can be in any suitable shape. For instance, the formable structure 100 can include a dam 103 having two or three walls. In addition, the formable structure 100 can include a dam 103 having walls each having different dimensions. Such configurations enable heat to be directed toward a particular direction. In addition, insulates, such as glass particles, can be loaded into portions of the dam 103 to prevent the transfer of heat in particular directions. The overall shape of the dam 103, and thus the overall shape of the inner filler 102, can also be in any shape to accommodate a shape of one or more components.

Figure 1B:
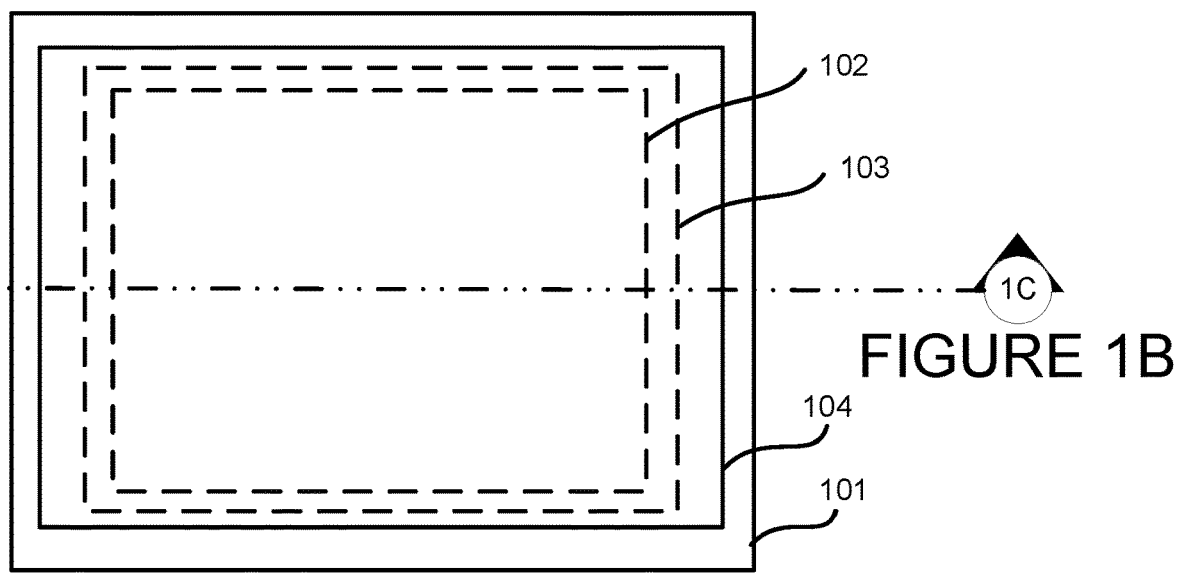
FIG. 1B is a top view of the formable structure positioned between a first component and a second component.
Figure 1C:
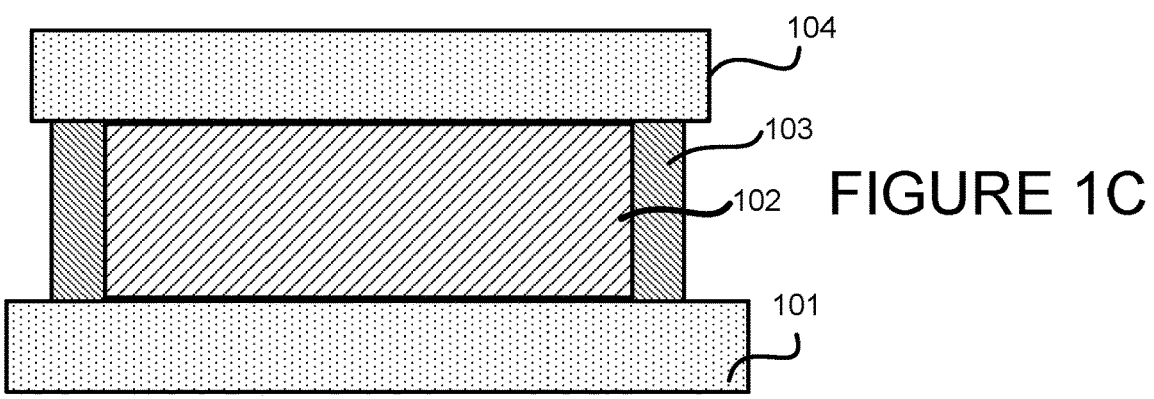
FIG. 1C a cross-sectional view of the formable structure, the first component, and the second component.

FIG. 1B and FIG. 1C respectively illustrate a top view and a cross-sectional view of the formable structure 100 positioned between a first component 101 and a second component 104 (collectively referred to herein as "components"). In this illustrative example, the inner material 102 is configured to have a predetermined degree of wet-out to create a suitable contact with the components to enable a desired level of thermal conductivity between the components and the inner material 102. As also shown, the dam 103 is formed to create a barrier to hold at least a portion of the inner filler 102 in a desired position and/or a desired shape. The dam 103 is configured to have a second level of viscosity, which can be a higher level of viscosity than the inner filler 102.

In some configurations, the inner filler 102 can be loaded with thermally conductive filler particles such as carbon-based particles, boron nitride, silica, alumina, metal particles, etc. The inner filler 102 can comprise a low viscosity filler, such as epoxy, silicone, urethane, or acrylic to help enable a high degree of wet-out, which will improve thermal connectivity between the components. The dam 103 can be configured to have a higher viscosity than the inner filler 102. The dam 103 can be loaded with a resin or other suitable substance for producing a desired level of viscosity. As will be described below, one or more processes can be implemented to produce a formable structure 100.

Figure 2A:
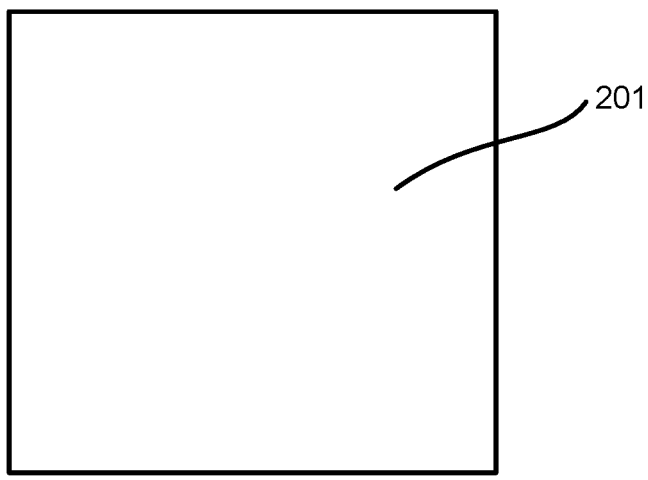
FIGS. 2A-2C illustrate several stages of a treatment-based process for producing a formable structure in accordance with configurations disclosed herein.

Referring now to FIG. 2A, aspects of a treatment-based process for producing a formable structure 100 are shown and described below. In one stage of the process, a curable material 201 is applied to a surface, such as a surface of a component. The component can be a chip, heat sink, or any other device, product, or article of manufacture. In such configurations, the curable material 201 can be configured to have a first level of viscosity, which may be suitable for creating a high degree of wet-out with a surface that comes in contact with the curable material 201. The curable material 201 can include a light-activated resin that is configured to harden the curable material 201 when exposed to specific light spectrums. In some configurations, the curable material 201 can include a resin that is configured to harden when exposed to other treatment methods, which may include the application of heat, chemicals, microwaves and/or any other suitable application. It can be appreciated that these examples are provided for illustrative purposes and are not to be construed as limiting, as the curable material 201 can include any type of material that can harden when exposed to any suitable treatment process, some of which may include the application of a treatment to select areas of the curable material 201.

Figure 2B:
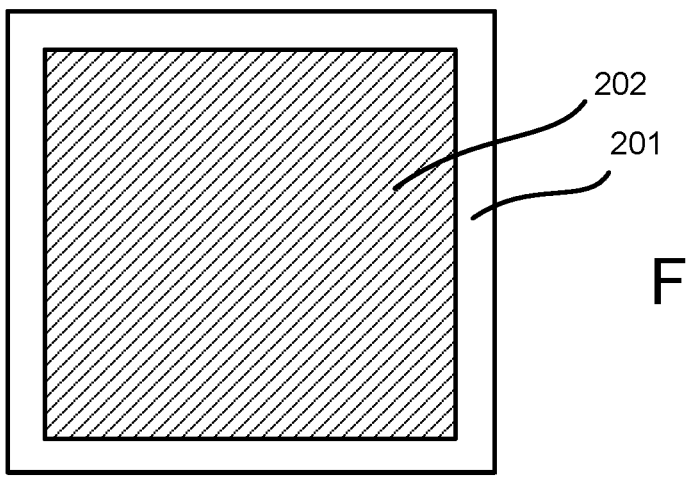

Next, as shown in FIG. 2B, a mask 202 is applied to the curable material 201. The mask 202 can be made from any material suitable for controlling the exposure of one or more treatments, such as a material for blocking the application of UV light or heat. As shown, the mask 202 is configured to expose a portion of the curable material 201, such that when the one or more treatments are applied, the exposed portion of the curable material 201 is hardened. The hardened portion can be cured to a point where the hardened portion is capable of holding the untreated portion, e.g., the unexposed portion, in a position and/or a shape.

Figure 2C:
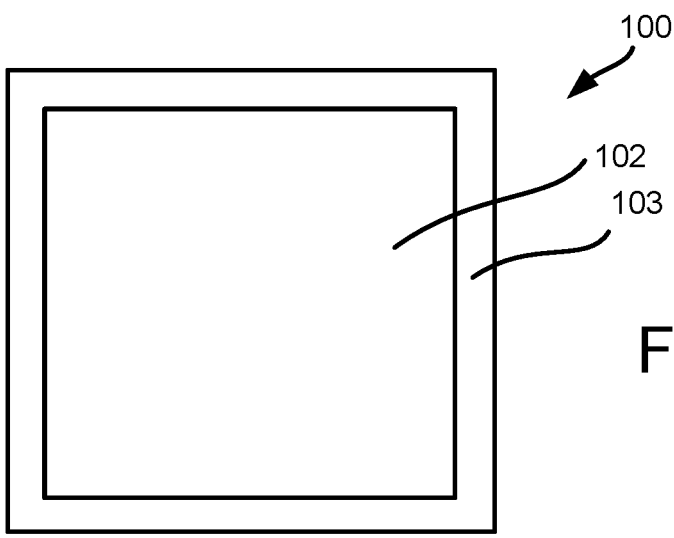

FIG. 2C illustrates formable structure 100 after the application of one or more treatment processes and after the removal of the mask 202. The portion that was exposed to the treatment process is altered to form the dam 103 having a higher level of viscosity than the untreated portion, which is also referred to herein as the inner filler 102. Once treated, another component can be placed on top of the formable structure 100 thus creating a thermal conductor between the two components.

Figure 3A:
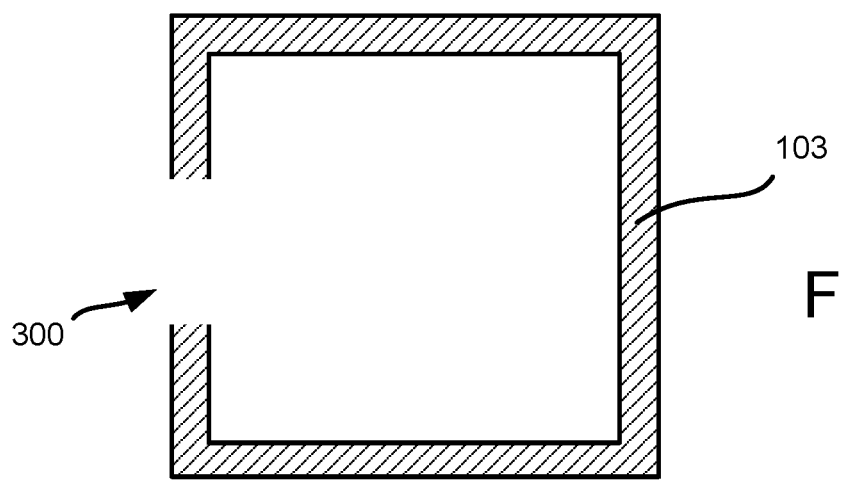
FIGS. 3A-3C illustrate several stages of a sealing-based process for producing a formable structure in accordance with configurations disclosed herein.
Figure 3B:
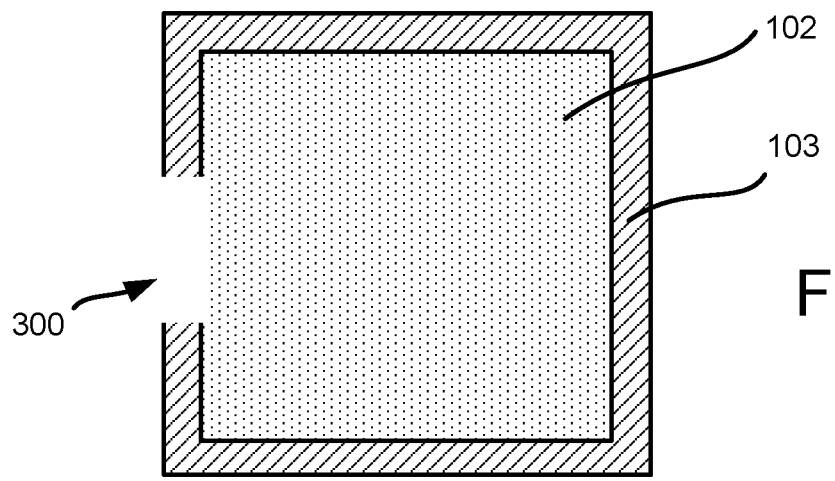
Figure 3C:
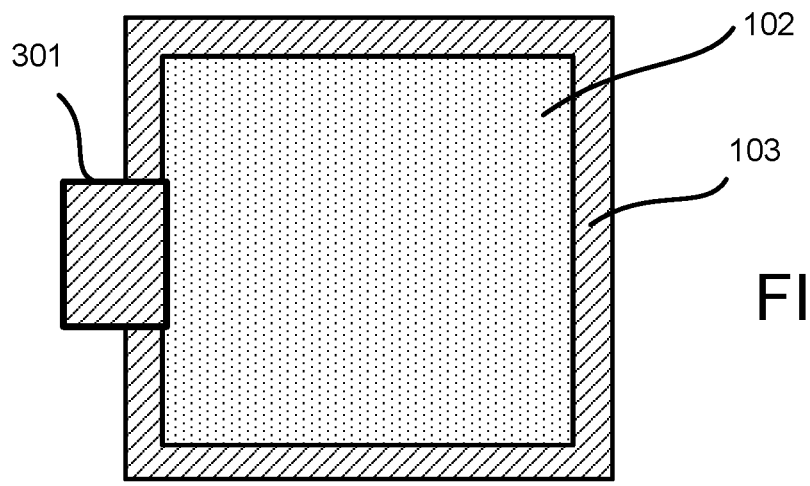

Referring now to FIGS. 3A-3C, a sealing-based process for producing a formable structure is shown and described below. In this process, the dam 103 is configured with a viscosity suitable for maintaining a desired shape. The dam 103 can be loaded with a high viscosity filler such as an epoxy. In some configurations, the dam 103 can include a resin that is configured to harden, e.g., raise the viscosity of, the dam 103 when exposed to one or more processes.

In the example shown in FIG. 3A, the dam 103 is formed into a square having four walls an opening 300 on one wall. The opening 300 can be any size or shape suitable for allowing one or more application devices to apply the inner filler 102 within the boundaries of the walls. The example shown in FIG. 3A is provided for illustrative purposes and not be construed as limiting. It can be appreciated that the opening 300 can be on any side of the dam 103 and the configurations disclosed herein can include any number of openings 300. It can be also appreciated that the dam 103 can be in any shape or size. In some configurations, the dam 103 can be formed to accommodate the shape of a component that is to be in contact with the dam 103.

Next, as shown in FIG. 3B, the inner filler 102 is applied to the interior portion of the dam 103 through the opening 300. In some configurations, the inner filler 102 can include a low viscosity filler, such as epoxy, silicone, urethane, or other like substance. The quantity of the inner filler 102 should be sufficient enough to provide a thermal connection between two or more components positioned next to, e.g., above and below, the dam 103. For example, with reference to the example of FIG. 1C, the inner filler 102 can have sufficient contact for enabling thermal connectivity with the first component 101 and the second component 104 respectively positioned on the bottom and top of the dam 103.

Next, as shown in FIG. 3C, the process includes the application of additional dam material 301 to seal the opening 300. In this example, the additional dam material 301 is size and shape to block the opening 300 and to prevent or mitigate the movement of the inner filler 102. In some configurations, the additional dam material 301 is loaded with one or more fillers such that the additional dam material 301 has a viscosity level similar to the viscosity level of the dam 103. The dam material 301 can be held in place by friction and/or by the use of an adhesive, e.g., an epoxy or other suitable resin.

Figure 4A:
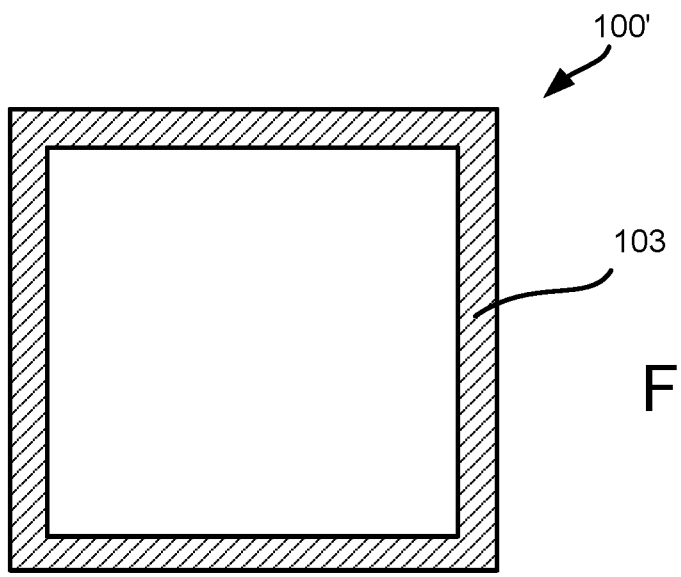
FIGS. 4A-4B respectively illustrate a top view and a perspective view of a self-sealing formable structure in accordance with configurations disclosed herein.
Figure 4B:
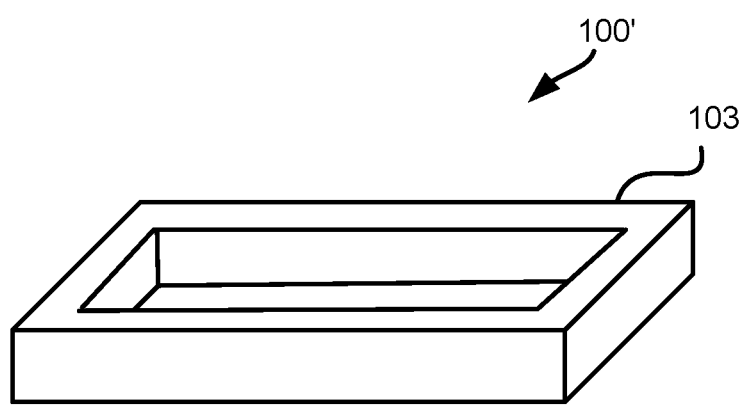

Referring now to FIGS. 4A-4B, aspects of a self-sealing formable structure 100' are shown and described below. In this illustrate example, the formable structure 100' comprises a dam 103 that is configured to hold filler material, such as the inner filler 102, in a particular position and/or a particular shape. The viscosity of the dam 103 can vary depending on the height of the formable structure 100' and the thickness of the walls of the formable structure 100'. In some configurations, the dam 103 is also configured to automatically seal a puncture hole. For example, if a needle is inserted into the side of the dam 103, the dam 103 can create a seal to retain any filler material after the needle is removed. To achieve this particular property, the dam 103 can be made with one or more materials that control the elasticity of the dam 103. It can be appreciated that any material causing the dam 103 to gel or coagulate can also be used.

Figure 5A:
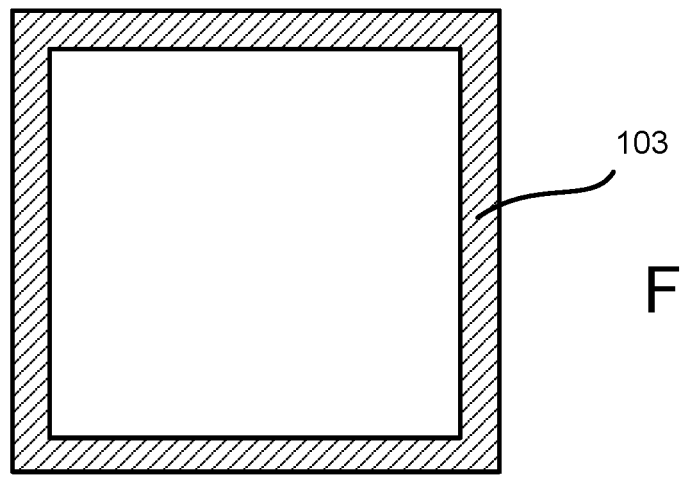
FIGS. 5A-5D illustrate several stages of a process for producing a self-sealing formable structure in accordance with configurations disclosed herein.

Referring now to FIGS. 5A-5D, aspects of a process for producing a self-sealing formable structure 100' are shown and described below. As shown in FIG. 5A, one or more processes can be used to produce the dam 103. The dam 103 can be formed by a one or more suitable techniques. For instance, the dam 103 can be formed with a molding process, an etching process, an injection process, a printing process, or any other suitable method for shaping a material having a viscosity configured to hold a filler material in place.

Figure 5B:
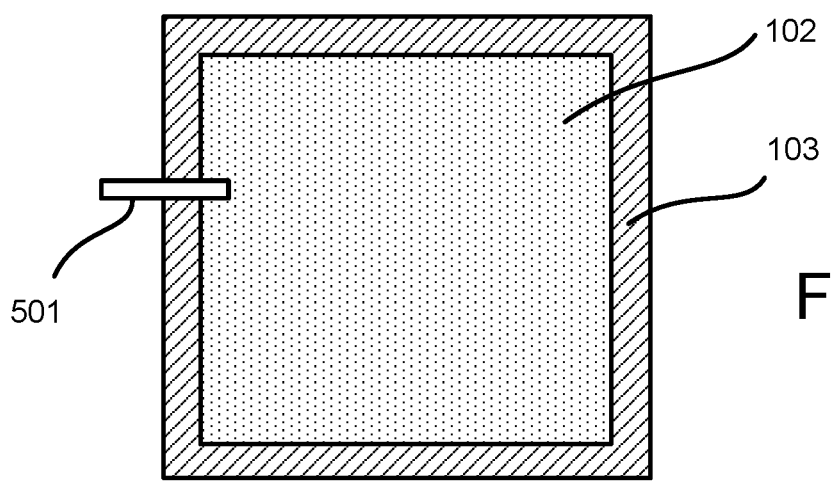
Figure 5C:
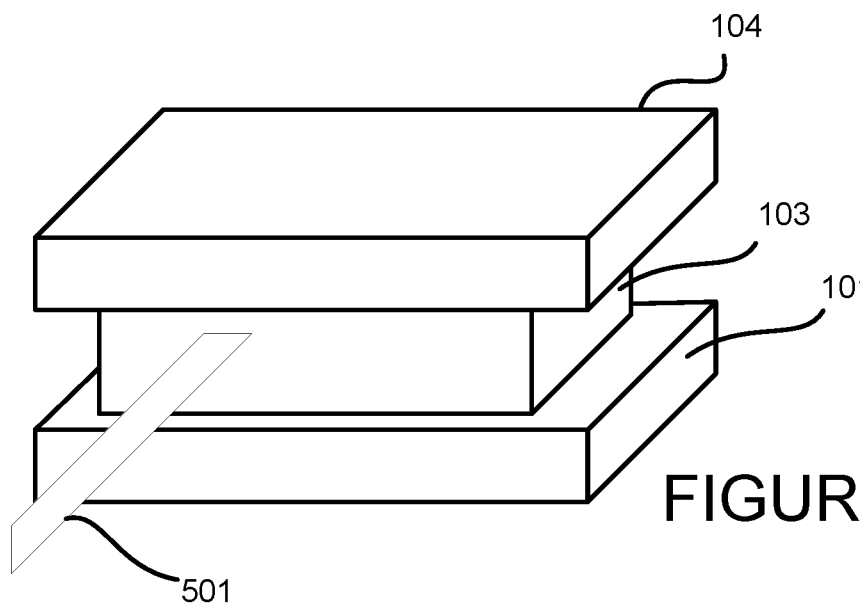
Figure 5D:
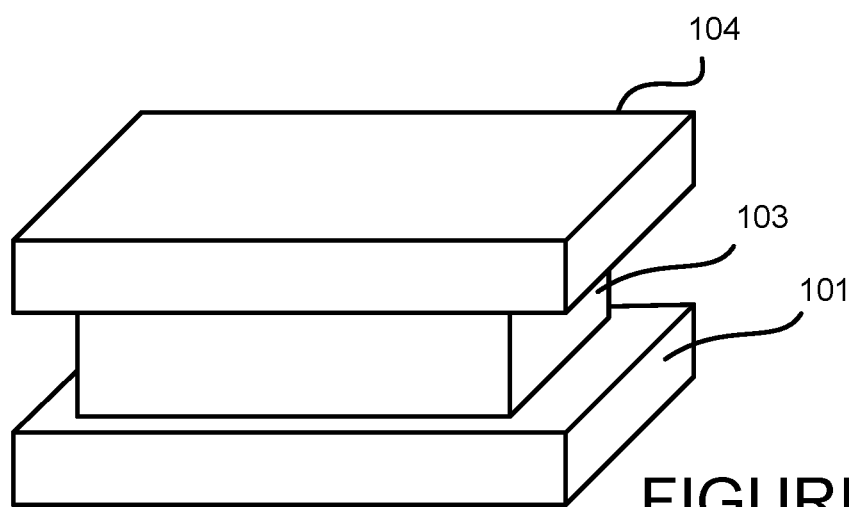

Next, as shown in FIG. 5B and FIG. 5C, the inner filler 102 is applied to the interior section of the dam 103. In this example, the inner filler 102 is applied to the interior section of the dam 103 by the use of a needle 501 having an appropriate gauge. The gauge of the needle 501 can be based, at least in part, on the viscosity and dimensions of the inner filler 102, wherein the needle 501 can have a gauge that allows the inner filler 102 to flow through the needle 501. In some configurations, the inner filler 102 can include a low viscosity filler, such as epoxy, silicone, urethane, or other like substance. The quantity of the inner filler 102 should be sufficient enough to provide a thermal connection between two or more components, such as the first component 101 and the second component 104, positioned above and below the dam 103. As shown in FIG. 5D, once the needle 501 is removed, the opening created by the needle 501 automatically closes upon a withdrawal of the needle 501.

As summarized above, the dam 103, also referred to herein as the "second material," can also be configured to cover one or more components to function as an EMI shield. As will be described in more detail below, by electrically connecting the dam 103 to one or more appropriate locations, such as a ground plane, the dam 103 can serve as an EMI shield as well as a barrier to hold the inner filler 102 in a particular position and/or a particular shape.

Figure 6A:
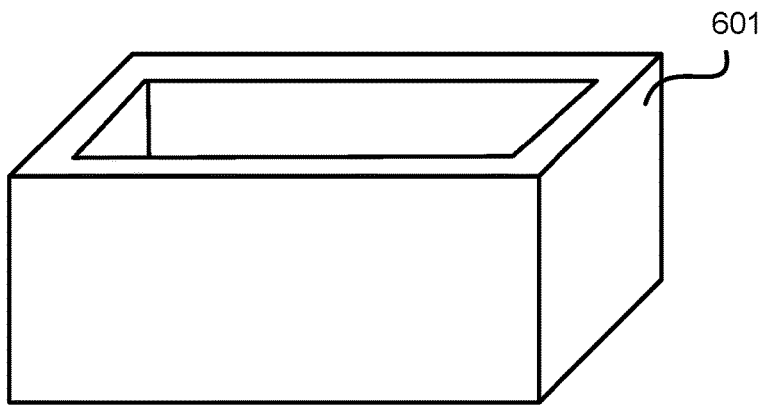
FIGS. 6A-6C illustrate several stages of a process for producing a formable structure configured to function as an EMI shield.
Figure 6B:
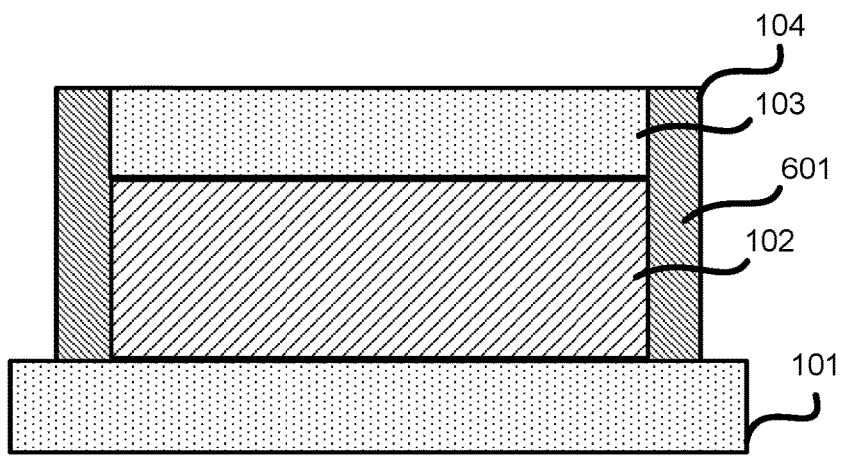
Figure 6C:
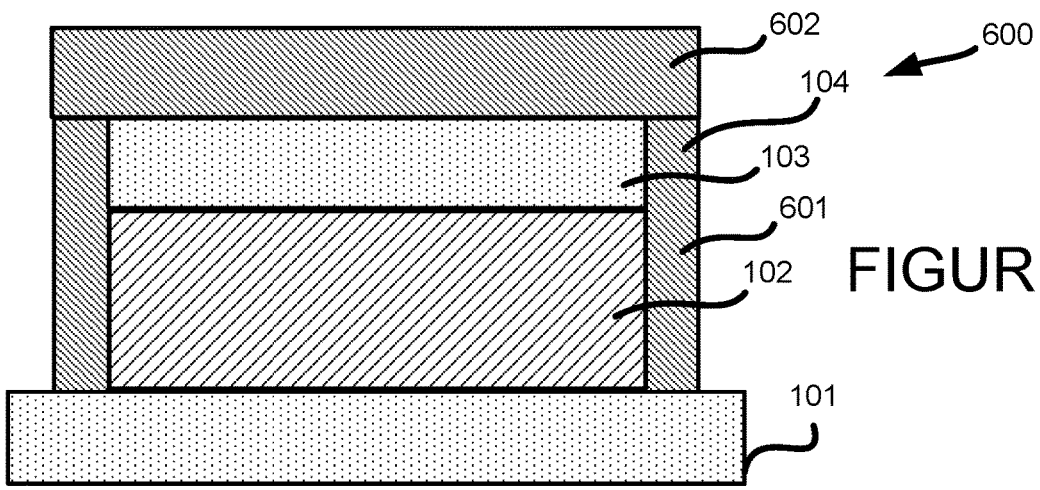

Referring to FIGS. 6A-6C, a process for producing a formable structure 600 configured to function as a barrier to hold the inner filler 102 and an EMI shield is shown and described. In one step of the process, as shown in FIG. 6A, the dam 601 is produced. In some configurations, the formable structure 600 comprises a dam 601 that is configured to hold filler material, such as the inner filler 102, in a particular position and/or a particular shape. In some configurations, a dam comprises one or more walls forming an interior section, where the walls surround at least a portion of the interior section. The viscosity of the dam 601 can vary depending on the height of the formable structure 600 and the thickness of the walls of the dam 601.

The dam 601 can be designed to be electrically conductive, and therefore can successfully serve as an EMI shield. The base matrix material of the dam 601 can be loaded with electrically conductive filler particles, such as various metals or carbon-based materials, thus making the dam 601 electrically conductive. By electrically connecting the dam in the appropriate locations, the dam 601 can then simultaneously serve as an EMI shield. As electrically conductive materials are frequently also highly thermally conductive, the dam itself will also contribute to an improved thermal performance of the system overall.

As shown in FIG. 6B, the inner filler 102 can be applied within the interior section of the dam 601. The inner filler 102 can be applied such that the inner filler 102 makes contact with a surface of a first component 101, which for example, can be a printed circuit board. The viscosity of the inner filler 102 can depend on a desired level of wet-out. In addition, the inner filler 102 can be loaded with a thermally conductive material such as those described herein. In addition, a second component 104, such as a processor, can be positioned above the inner filler 102. The position and configuration of the first component 101, second component 104, and the inner filler 102 enables thermal connectivity between the first component 101 and the second component 104.

As shown in FIG. 6C, the process also includes the application of a top surface 602. In some configurations, the top surface 602 is configured with the dam 601 to create an EMI shield for the second component 104. To achieve the formation of an EMI shield around the second component 104, some configurations involve an electrical connection between at least two sides of the dam 601 across the top of the second component 104, thus effectively forming a cage. The electrically conductive dam 103 forms the sides of the cage, and the top surface 602 forms the roof of the cage. There are multiple methods through which this could be achieved.

In some configurations, the formation of the cage can involve direct metallization of the top surface 602 on a component, such as the second component 104. Such configurations can involve physical vapor deposition (PVD) of metal. After metallization, configurations disclosed herein can utilize either an electrically conductive adhesive to attach the dam 103 to the metallic layer, or directly solder the dam 103 to the top of the component 104, depending on the composition of the dam 103. The dam 103 can be connected to a ground plane of the first component 101, e.g., a PCB ground plane. Such configurations can help ensure that the combination of the dam 103 and the top surface 602, e.g., the metallized surface, functions as an effective EMI shield for one or more components.

In some configurations, the formation of the cage can involve the use of a separate sheet of metal as the top surface 602 of the cage. The sheet of metal can be attached to the electrically conductive dam 103 via a variety of methods. These methods can include the use of solder, electrically conductive adhesives, and/or electrically conductive tapes. As in the case with other techniques disclosed herein, the dam 103 can be connected to a ground plane.

In some configurations, other electrically conductive materials other than sheets of metal can also function effectively as the top surface 602. For example, materials such as Cu-clad Kapton tape can also be an option for the top surface 602. As with other techniques disclosed herein, some form of electrically conductive adhesion method can be used to attach the electrically conductive material to the dam 103 to finish the formation of the cage.

In some configurations, the inner filler 102 can be applied to the formable structure 600 after the cage and/or the dam 103 are created. For example, the thermally conductive filler material can be injected into the interior of the dam 103. If the dam 103 comprises a self-sealing material, the interior section created by the dam 103 can be filled with thermally conductive, and possibly electrically isolating, filler material. The filler material can be injected directly through the dam 103 with an appropriate gauge syringe. As described above, the hole created by such a device can be automatically resealed in the case of a self-sealing material.

If the dam 103 is not made of a self-sealing material, as described above, a hole can be created in the dam 103 when it is initially created. The hole will be used to allow for the injection of the interior thermally conductive and electrically isolating filler material into the interior section created by the dam 103. After the interior filler material is applied, an additional piece of the dam material can be applied to seal off the existing hole. A top-down schematic view of this set up is shown in FIG. 2. The interior filler material consists of a base polymer matrix material, such as an epoxy, acrylate, polyurethane, or silicone, which is loaded with some type of electrically insulating, thermally conductive filler particles. The filler particles could potentially be alumina, boron nitride, other ceramic materials, or carbon-based materials. This combination creates a low-viscosity, highly thermally conductive interior filler material.

Examples provided herein are for illustrative purposes and are not be construed as limiting. It can be appreciated that the dam 103 can be formed using any suitable technique, including one or more techniques involving a molding process, etching process, or a three-dimensional printing process. The dam 103 can also be formed into a single piece, which can include the dam walls as well as the top surface. In addition, the dam 103 can be formed by many parts including multiple walls that are joined to form a cage, which can be formed with or without a top surface. Such forms may include a tent structure, a dome, an A-frame structure, a tipi structure, or any other suitable shape.

Figure 7:
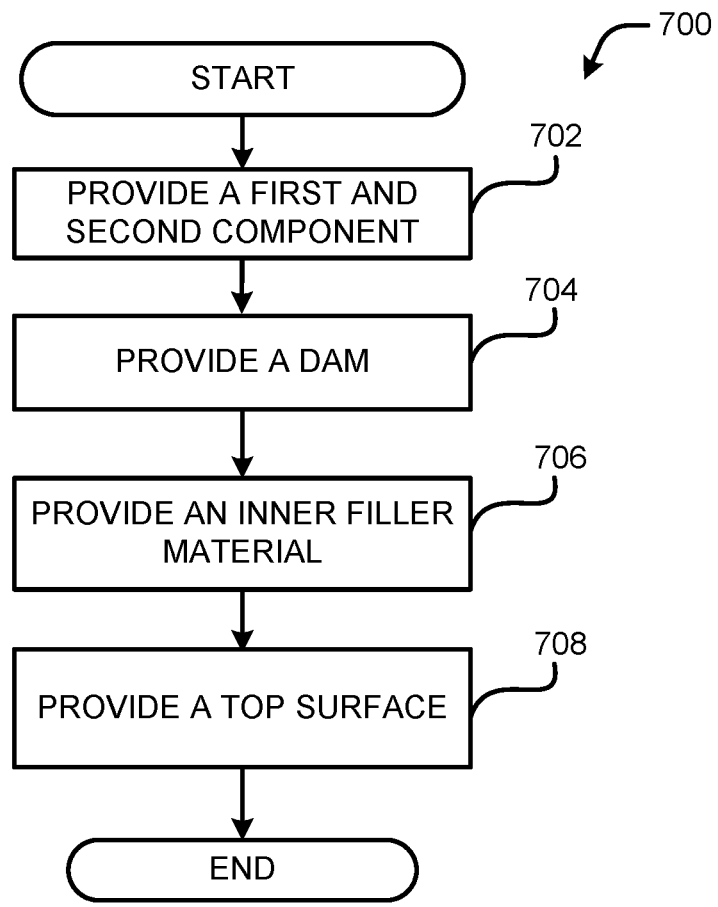
FIGS. 7 and 8 illustrate some aspects of two example processes for producing formable structures.
Figure 8:
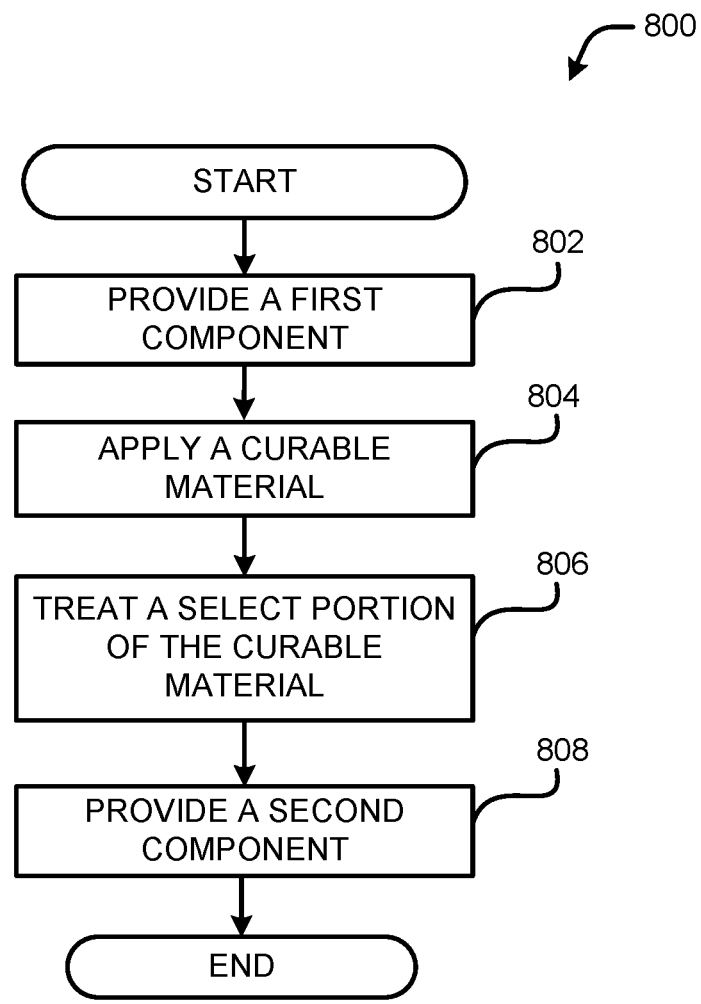

Referring now to FIG. 7 and FIG. 8, aspects of two example processes for producing formable structures are shown and described below. It should be understood that the stages of the processes are not necessarily presented in any particular order and that performance of some or all of the stages in an alternative order(s) is possible and is contemplated. The stages have been presented in the demonstrated order for ease of description and illustration. Stages can be added, omitted, and/or performed simultaneously, without departing from the scope of the appended claims. It also should be understood that the illustrated processes can end at any time and need not be performed in its entirety.

In one example, a formable structure, such as the formable structure 600 shown in FIG. 6, can be produced by a filling process 800. Such a process, for instance, can be used when the formable structure 600 is to be fitted between a first component and a second component that are mounted, e.g., affixed, at a predetermined distance from one another. Aspects of such techniques, and other techniques disclosed herein, can also be used for forming a stand-alone formable structure that can be later placed between components and/or into a device or other article of manufacture.

The process 700 starts at stage 702 where the first component 101 and a second component 104 are provided. In this illustrative example, the first component 101 can be a PCB, and the second component 104 can be a chip, e.g., a processor that is mounted to the PCB. In this example, the second component 104 is mounted at a predetermined distance above the first component 101.

Next, at stage 704, a dam 601 is provided. In general, the dam 601 that is configured to hold one or more forms of filler material, such as the inner filler 102, in a particular position and/or a particular shape. The dam 601 can be in any shape or size depending on a given application. For instance, the dam 601 can be shaped to accommodate the shape of a component that is to be in contact with the dam 601. The viscosity of the dam 601, which can vary depending on the height and dimensions of the dam 601, can be at a level sufficient to hold the dam 601 to maintain the dam 601 in a position and/or a form in a given operating environment. In some configurations, among other properties described herein, the dam 601 can also be configured to automatically seal a puncture hole. In some configurations, the dam 601 can have an opening for allowing the application of the inner filler 102. When an application calls for an EMI shield, the dam 601 can include a metallic filler for enabling the dam 601 to function as an EMI shield.

The dam 601 can also include a curable material, such as a light-activated resin that is configured to harden when exposed to specific light spectrums. In such configurations, the uncured resin can be inserted into a given position between the components and then exposed to one or more treatment methods, which may include the application of a UV-light or heat. These examples are provided for illustrative purposes and are not limiting. Any suitable process for providing a dam 601 having a predetermined viscosity can be utilized in this stage of the process.

Next, at stage 706, an inner filler 102 is provided. In some configurations, the inner filler 102 is injected into an inner portion for the dam 601 using one or more devices, such as an appropriately gauged needle. The inner filler 102 can be applied through an opening in the dam 102 or through a puncture hole created by the one or more devices used to inject the inner filler 102. The inner filler 102 can be loaded with thermally conductive filler particles such as carbon-based particles, boron nitride, silica, alumina, metal particles, etc. The inner filler 102 can also comprise a low viscosity filler, such as epoxy, silicone, urethane, or acrylic to help enable a high degree of wet-out, which will improve thermal connectivity between the components. If the dam 103 has an opening, one or more techniques can be used to seal the opening, including the insertion of a material having a viscosity that is similar to the viscosity of the dam 103.

When an application calls for an EMI shield, the process 700 can also include a stage, referred to herein as stage 708, where the top surface 602 is provided. In some configurations, the top surface 602 is attached to the dam 601 to create an EMI shield for the second component 104. To achieve the formation of an EMI shield around the second component 104, some configurations involve an electrical connection between at least two sides of the dam 601 across the top of the second component 104, thus effectively forming a cage. The electrically conductive dam 601 forms the sides of the cage, and the top surface 602 forms the roof of the cage. As disclosed herein, there are multiple methods through which this could be achieved.

Referring now to FIG. 8, aspects of an example treatment process 800 for forming a formable structure, such as the formable structure 100 shown in FIG. 1C, are shown and described below. Such a process, for instance, can be used when the formable structure 100 can be applied to a first component before a second component is mounted to the first component. Aspects of such techniques, and other techniques disclosed herein, can also be used for forming a stand-alone formable structure that can be later placed into a device or other article of manufacture.

The process 800 starts at stage 802 where a first component 101 is provided. For example, the first component 101 can be a chip, such as a memory chip or processor, a PCB, or any other device, product, or article of manufacture. Next, at stage 804, a curable material 201 is applied to at least one surface of the first component 101. In some configurations, the curable material 201 can be configured to have a first level of viscosity, which may be suitable for creating a high degree of wet-out with the component 101. The curable material 201 can also include a light-activated resin that is configured to harden when exposed to specific light spectrums. In some configurations, the curable material 201 can include a resin that is configured to harden when exposed to other treatment methods, which may include the application of heat. It can be appreciated that this example is provided for illustrative purposes and is not to be construed as limiting, as the curable material 201 can include any type of material that can harden when exposed to any suitable treatment process, some of which may include the application of heat and/or light to specific areas.

Next, at stage 806, a select portion of the curable material 201 is treated. Aspects of stage 806 are described herein and shown in FIG. 2B. In some configurations, a mask 202 is applied to the top of the curable material 201. The mask 202 can be made from any material suitable for controlling the exposure of one or more treatments, such as a material for blocking a UV light or heat. As shown, the mask 202 is configured to expose a select portion of the curable material 201, such that when the one or more treatments are applied, the exposed portion of the curable material 201 is hardened. The hardened portion can be cured to a point where the hardened portion is capable of holding the untreated portion, e.g., the unexposed portion, in place. The application of the treatment process produces a structure 100 having an inner filler 102 surrounded by a dam 103.

Next, at stage 808, the second component 104 is provided. The second component 104 can be a chip, heat sink, PCB or any other structure that is to be thermally coupled with the first component 101. In some configurations, the second component 104 is positioned to have physical contact with the inner filler 102, thereby creating a thermal conductor between the first component 101 and the second component 104. Aspects of the second component are shown in FIG. 1C and described above.

Based on the foregoing, it should be appreciated that concepts and technologies have been disclosed herein that provide formable interface and shielding structures. Although the subject matter presented herein has been described in language specific to some structural features, methodological and transformative acts, and specific machinery, it is to be understood that the invention defined in the appended claims is not necessarily limited to the specific features or acts described herein. Rather, the specific features and acts are disclosed as example forms of implementing the claims.

The subject matter described above is provided by way of illustration only and should not be construed as limiting. Various modifications and changes may be made to the subject matter described herein without following the example configurations and applications illustrated and described, and without departing from the true spirit and scope of the present invention, which is set forth in the following claims.

What is claimed is:

1. A method of forming a thermal conductor between a first component and a second component, the method comprising:
   applying, to a surface of a first component, a curable material that includes a resin that is configured to cause a viscosity of the curable material to increase when exposed to one or more treatments;
   applying a protective mask to block one or more select portions of the curable material, thereby creating one or more exposed portions of the curable material that form a perimeter around the one or more select portions;
   applying the one or more treatments to the curable material, thereby increasing the viscosity of the one or more exposed portions of the curable material, wherein application of the one or more treatments results in:
   the one or more select portions having a first viscosity level,
   the one or more exposed portions having a second viscosity level that is greater than the first viscosity level, the second viscosity level sufficient for holding the one or more select portions within the perimeter that is formed by the one or more exposed portions; and subsequent to applying the one or more treatments, mounting a second component in thermal contact with a second surface of the one or more select portions, of the curable material, that is opposite a first surface of the one or more select portions that is in contact with the first component, wherein a bottom surface of the second component is in contact with a top surface of the one or more select portions at a location that is below a top surface of the one or more exposed portions.

2. The method of claim 1, the curable material including at least one of carbon-based particles, boron nitride, silica, alumina, metal particles, or a combination thereof.

3. The method of claim 1, the curable material including at least one of an epoxy, a silicone, a urethane, an acrylic, or a combination thereof.

4. The method of claim 1, the curable material including at least one of carbon-based particles, boron nitride, silica, alumina, or metal particles, and the curable material including at least one of an epoxy, a silicone, a urethane, or an acrylic.

5. The method of claim 1, the resin is a light-activated resin that causes the viscosity of the exposed portions of the curable material when exposed to a light-based treatment.

6. The method of claim 1, the curable material includes an electrically conductive filler, the electrically conductive filler causes the curable material to be electrically conductive, the second viscosity level sufficient for holding the exposed portions in a position around the second component.

7. The method of claim 1, further comprising:
mounting a bottom surface of a third component in contact with each of a top surface, of the second component, and a top surface of the one or more exposed portions having the second viscosity, wherein the bottom surface of the third component and the one or more exposed portions form a cage around the second component.

8. The method of claim 7, wherein the top surface and the one or more exposed portions are electrically conductive and electrically grounded to form an electromagnetic interference (EMI) shield around the second component.

* * * * *